US010153356B2

(12) United States Patent
Oka et al.

(10) Patent No.: US 10,153,356 B2
(45) Date of Patent: *Dec. 11, 2018

(54) METHOD OF MANUFACTURING SEMICONDUCTOR DEVICE, AND SEMICONDUCTOR DEVICE

(71) Applicant: TOYODA GOSEI CO., LTD., Kiyosu-shi (JP)

(72) Inventors: Tohru Oka, Kiyosu (JP); Nariaki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/460,069

(22) Filed: Mar. 15, 2017

(65) Prior Publication Data
US 2017/0278952 A1    Sep. 28, 2017

(30) Foreign Application Priority Data
Mar. 24, 2016  (JP) .................................. 2016-059903

(51) Int. Cl.
*H01L 29/66* (2006.01)
*H01L 21/225* (2006.01)
(Continued)

(52) U.S. Cl.
CPC .... *H01L 29/66734* (2013.01); *H01L 21/2258* (2013.01); *H01L 21/266* (2013.01);
(Continued)

(58) Field of Classification Search
CPC ............. H01L 29/66734; H01L 21/266; H01L 29/7813; H01L 29/7809; H01L 29/1095; H01L 21/26546; H01L 21/2258
See application file for complete search history.

(56) References Cited

U.S. PATENT DOCUMENTS 5,910,669 A    6/1999  Chang et al.
2009/0114969 A1  5/2009  Suzuki et al.
(Continued)

FOREIGN PATENT DOCUMENTS

| JP | H 06-224437 A | 8/1994 |
| JP | 2001-267570 A | 9/2001 |
| JP | 2009-117593 A | 5/2009 |

OTHER PUBLICATIONS

United States Office Action dated Nov. 15, 2017 in co-pending U.S. Appl. No. 15/456,269.
United States Office Action dated May 21, 2018 in U.S. Appl. No. 15/456,269.

*Primary Examiner* — Dung Le
(74) *Attorney, Agent, or Firm* — McGinn IP Law Group, PLLC

(57) ABSTRACT

A technique of suppressing the potential crowding in the vicinity of the outer periphery of a bottom face of a trench without ion implantation of a p-type impurity is provided. A method of manufacturing a semiconductor device having a trench gate structure comprises an n-type semiconductor region forming process. In the n-type semiconductor region forming process, a p-type impurity diffusion region in which a p-type impurity contained in a p-type semiconductor layer is diffused is formed in at least part of an n-type semiconductor layer that is located below an n-type semiconductor region.

19 Claims, 11 Drawing Sheets

(51) Int. Cl.
*H01L 21/265* (2006.01)
*H01L 21/266* (2006.01)
*H01L 29/10* (2006.01)
*H01L 29/20* (2006.01)
*H01L 29/207* (2006.01)
*H01L 29/78* (2006.01)
*H01L 21/324* (2006.01)

(52) U.S. Cl.
CPC .. *H01L 21/26546* (2013.01); *H01L 21/26553* (2013.01); *H01L 21/3245* (2013.01); *H01L 29/1095* (2013.01); *H01L 29/2003* (2013.01); *H01L 29/207* (2013.01); *H01L 29/66522* (2013.01); *H01L 29/7809* (2013.01); *H01L 29/7813* (2013.01)

(56) References Cited

U.S. PATENT DOCUMENTS

| | | | | |
|---|---|---|---|---|
| 2012/0153355 A1* | 6/2012 | Umeda | ............... | H01L 29/2003 257/192 |
| 2013/0285140 A1* | 10/2013 | Kagawa | ............. | H01L 29/7811 257/330 |
| 2014/0377942 A1* | 12/2014 | Noguchi | ............... | H01L 21/266 438/529 |
| 2017/0025524 A1* | 1/2017 | Kinoshita | ......... | H01L 21/02378 |
| 2017/0263701 A1* | 9/2017 | Oka | .................... | H01L 29/0638 |

* cited by examiner

METHOD OF MANUFACTURING SEMICONDUCTOR DEVICE, AND SEMICONDUCTOR DEVICE

CROSS-REFERENCE TO RELATED APPLICATION

The present application claims priority from Japanese patent applications No. 2016-059903 filed on Mar. 24, 2016, the content of which is hereby incorporated by reference into this application.

BACKGROUND

Field

The disclosure relates to a method of manufacturing a semiconductor device, and a semiconductor device.

Related Art

A semiconductor device having a trench-type insulated structure has been known conventionally (as described in, for example, JP H06-224437A, JP 2001-267570A and JP 2009-117593A). In the methods disclosed in JP H06-224437A, JP 2001-267570A and JP 2009-117593A, a p-type semiconductor region is provided in the vicinity of the outer periphery of a bottom face of a trench by ion implantation, with a view to suppressing the potential crowding in the vicinity of the outer periphery of the bottom face of the trench.

In some semiconductors such as a gallium nitride (GaN)-based semiconductor, however, there may be a difficulty in forming the p-type semiconductor region by ion implantation. The ion implantation may be likely to arise a defect of crystal in the semiconductor, and such a defect may be unlikely to be recovered by heat treatment. There is accordingly a need for a technique that suppresses the potential crowding in the vicinity of the outer periphery of a bottom face of a trench without ion implantation of a p-type impurity.

SUMMARY

In order to solve at least part of the problems described above, the disclosure may be implemented by aspects described below.

(1) According to one aspect of the invention, there is provided a method of manufacturing a semiconductor device having a trench gate structure. The method of manufacturing the semiconductor device comprises: a stacking process of stacking a p-type semiconductor layer containing a p-type impurity on an n-type semiconductor layer containing an n-type impurity; an n-type semiconductor region forming process of forming an n-type semiconductor region in at least part of the p-type semiconductor layer by ion-implanting an n-type impurity into the p-type semiconductor layer and performing heat treatment to activate the ion-implanted n-type impurity; and a trench forming process of forming a trench that is recessed to pass through the p-type semiconductor layer and reach the n-type semiconductor layer, wherein in the n-type semiconductor region forming process, a p-type impurity diffusion region in which the p-type impurity contained in the p-type semiconductor layer is diffused is formed in at least part of the n-type semiconductor layer that is located below the n-type semiconductor region. The method of manufacturing the semiconductor device of this aspect suppresses the potential crowding in the vicinity of the outer periphery of a bottom face of the trench without ion implantation of a p-type impurity.

(2) According to one embodiment of the method of manufacturing the semiconductor device, a bottom face of the p-type impurity diffusion region may be located to be flush with a bottom face of the trench or is located below the bottom face of the trench with respect to a direction of the stacking. The method of manufacturing the semiconductor device of this aspect more effectively suppresses the potential crowding in the vicinity of the outer periphery of the bottom face of the trench.

(3) According to one embodiment of the method of manufacturing the semiconductor device, the trench forming process may be performed after the n-type semiconductor region forming process, and in the trench forming process, the trench may be formed at a location that is overlapped with at least part of the p-type impurity diffusion region, and at least part of the bottom face of the trench is formed by the p-type impurity diffusion region. The method of manufacturing the semiconductor device of this aspect more effectively suppresses the potential crowding in the vicinity of the outer periphery of the bottom face of the trench.

(4) According to one embodiment of the method of manufacturing the semiconductor device, the stacking process may comprise a process of stacking a buffer layer on a substrate and a process of stacking the n-type semiconductor layer on the buffer layer, wherein the substrate may be formed from a semiconductor different from semiconductors of the n-type semiconductor layer and the p-type semiconductor layer. The method of manufacturing the semiconductor device of this aspect also suppresses the potential crowding in the vicinity of the outer periphery of the bottom face of the trench.

(5) According to one embodiment, the method of manufacturing the semiconductor device may further comprise: a process of forming an insulation film inside of the trench; a process of forming a first electrode that is adjacent to and in contact with the n-type semiconductor region; a process of forming a second electrode on the n-type semiconductor layer; and a process of forming a control electrode configured to control a flow of electric current between the first electrode and the second electrode, on the insulation film. The method of manufacturing the semiconductor device of this aspect also suppresses the potential crowding in the vicinity of the outer periphery of the bottom face of the trench.

(6) According to one embodiment of the method of manufacturing the semiconductor device, each of the n-type semiconductor layer and the p-type semiconductor layer may be mainly made of a nitride semiconductor. The method of manufacturing the semiconductor device of this aspect also suppresses the potential crowding in the vicinity of the outer periphery of the bottom face of the trench.

The disclosure may be implemented by any of various aspects other than the method of manufacturing the semiconductor device having the trench gate structure described above, for example, a semiconductor device having a trench gate structure or an apparatus of manufacturing a semiconductor device according to the manufacturing method described above.

The method of manufacturing the semiconductor device according to any one of the aspects described above suppresses the potential crowding in the vicinity of the outer periphery of the bottom face of the trench without ion implantation of a p-type impurity.

DESCRIPTION OF EMBODIMENTS

A. First Embodiment

A-1. Structure of Semiconductor Device

Figure 1:
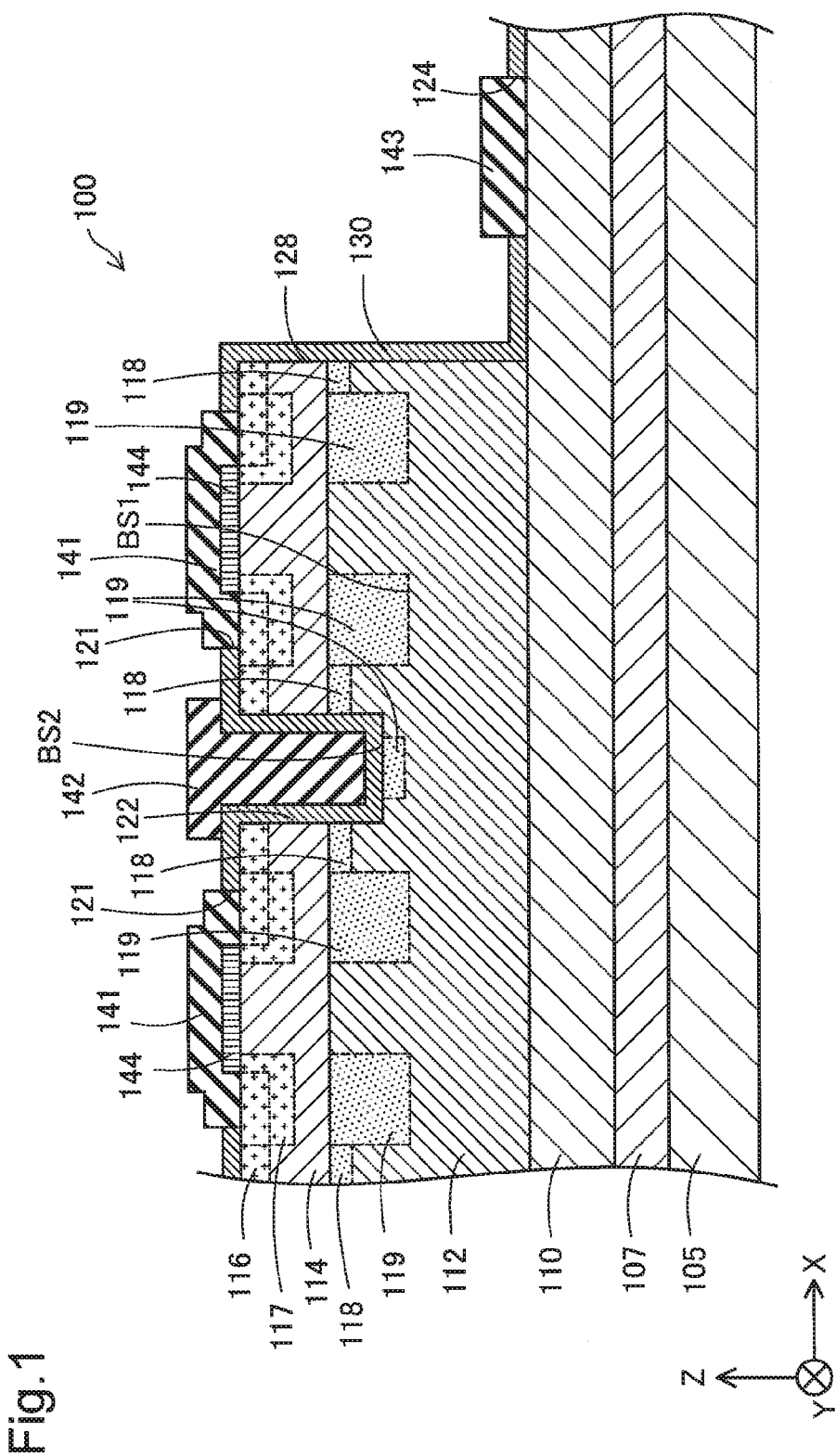
FIG. 1 is a sectional view schematically illustrating the structure of a semiconductor device according to a first embodiment.

FIG. 1 is a sectional view schematically illustrating the structure of a semiconductor device 100 according to a first embodiment. The semiconductor device 100 is a GaN-based semiconductor device formed by using gallium nitride (GaN). The semiconductor device 100 has a trench gate structure. In the description hereof, the "trench gate structure" denotes a structure that a trench is formed in a semiconductor layer and at least part of a gate electrode is embedded in the trench. According to this embodiment, the semiconductor device 100 is a vertical trench MISFET (metal-insulator semiconductor field-effect transistor). According to this embodiment, the semiconductor device 100 is used for power control and is also called power device.

XYZ axes orthogonal to one another are illustrated in FIG. 1. Among the XYZ axes of FIG. 1, the X axis denotes a left-right axis on the sheet surface of FIG. 1. +X-axis direction denotes a rightward direction on the sheet surface, and −X-axis direction denotes a leftward direction on the sheet surface. Among the XYZ axes of FIG. 1, the Y axis denotes a front-back axis on the sheet surface of FIG. 1. +Y-axis direction denotes a backward direction on the sheet surface, and −Y-axis direction denotes a forward direction on the sheet surface. Among the XYZ axes of FIG. 1, the Z axis denotes a top-bottom axis on the sheet surface of FIG. 1. +Z-axis direction denotes an upward direction on the sheet surface, and −Z-axis direction denotes a downward direction on the sheet surface.

The semiconductor device 100 includes a substrate 105, a buffer layer 107, n-type semiconductor layers 110 and 112, p-type impurity diffusion regions 118 and 119, a p-type semiconductor layer 114 and n-type semiconductor regions 116 and 117. The semiconductor device 100 further includes an insulation film 130, source electrodes 141, body electrodes 144, a gate electrode 142 and a drain electrode 143 and also has a trench 122 and a concave portion 128. The n-type semiconductor layers 110 and 112 and the p-type semiconductor layer 114 are collectively and simply called semiconductor layers. The source electrodes 141 and the body electrodes 144 are also called first electrodes 141 and 144. The drain electrode 143 is also called second electrode 143. The gate electrode 142 is also called control electrode 142.

The substrate 105 of the semiconductor device 100 is a plate-like semiconductor extended along the X axis and the Y axis. According to this embodiment, the substrate 105 is formed from a semiconductor different from the semiconductors of the n-type semiconductor layer 112 and the p-type semiconductor layer 114. The substrate 105 is a sapphire substrate mainly made of sapphire ($Al_2O_3$). In the description hereof, the expression of "mainly made of X (for example, sapphire ($Al_2O_3$))" means containing X (for example, sapphire ($Al_2O_3$)) at 90% or higher molar fraction.

The buffer layer 107 of the semiconductor device 100 is a semiconductor layer that is located on a +Z-axis direction side of the substrate 105 and is extended along the X axis and the Y axis. According to this embodiment, the buffer layer 107 is mainly made of aluminum nitride (AlN).

The n-type semiconductor layer 110 of the semiconductor device 100 is a plate-like semiconductor layer that is located on a +Z-axis direction side of the buffer layer 107 and is extended along the X axis and the Y axis. The n-type semiconductor layer 110 is mainly made of a nitride semiconductor and is mainly made of gallium nitride (GaN) according to this embodiment. According to this embodiment, the n-type semiconductor layer 110 is an n-type semiconductor containing silicon (Si) as a donor element. According to this embodiment, the average concentration of silicon (Si) contained in the n-type semiconductor layer 110 may be, for example, $5 \times 10^{18}$ $cm^{-3}$. The thickness (length in the Z-axis direction) of the n-type semiconductor layer 110 may be, for example, 0.5 μm (micrometer). The nitride semiconductor used is not limited to gallium nitride (GaN) but may be, for example, indium gallium nitride (InGaN), aluminum gallium nitride (AlGaN) or indium aluminum gallium nitride (InAlGaN).

The n-type semiconductor layer 112 of the semiconductor device 100 is a semiconductor layer that is located on a +Z-axis direction side of the n-type semiconductor layer 110 and is extended along the X axis and the Y axis. The n-type semiconductor layer 112 is mainly made of a nitride semiconductor and is mainly made of gallium nitride (GaN) according to this embodiment. According to this embodiment, the n-type semiconductor layer 112 is an n-type semiconductor containing silicon (Si) as a donor element. According to this embodiment, the average concentration of silicon (Si) contained in the n-type semiconductor layer 112 is lower than the average concentration of silicon (Si) contained in the n-type semiconductor layer 110 and may be, for example, $5 \times 10^{16}$ $cm^{-3}$. According to this embodiment, the thickness (length in the Z-axis direction) of the n-type semiconductor layer 112 may be, for example, 3.5 μm.

The p-type impurity diffusion regions 118 and 119 are at least partial areas on a +Z-axis direction side of the n-type semiconductor layer 112 and are areas including a p-type impurity. For the purpose of better understanding of the technique, the p-type impurity diffusion regions 118 and 119 denote areas having the higher concentration of the p-type impurity than the concentration of the n-type impurity in this drawing.

The p-type impurity diffusion regions 118 and 119 are areas that are located below the n-type semiconductor regions 116 and 117 and are formed in an n-type semiconductor region forming process described later. More specifically, the p-type impurity diffusion region 118 is located below the n-type semiconductor region 116, and the p-type impurity diffusion region 119 is located below the n-type semiconductor region 117. The term "below" herein means a location that is on the n-type semiconductor layer 112-side (−Z-axis direction side) of the p-type semiconductor layer 114 with regard to the stacking direction of the n-type semiconductor layer 112 and the p-type semiconductor layer 114 (Z-axis direction) and that is at least partly overlapped in the view from the stacking direction (Z-axis direction). The thickness (length in the Z-axis direction) of the p-type impurity diffusion region 118 is related to the thickness or the concentration of the n-type semiconductor region 116. The thickness (length in the Z-axis direction) of the p-type impurity diffusion region 119 is related to the thickness or the concentration of the n-type semiconductor region 117. According to this embodiment, the thickness of the n-type semiconductor region 117 is greater than the thickness of the n-type semiconductor region 116, so that the thickness of the p-type impurity diffusion region 119 is greater than the thickness of the p-type impurity diffusion region 118. The p-type impurity diffusion regions 118 and 119 are semiconductor areas that are extended along the X axis and the Y axis. According to this embodiment, the p-type impurity diffusion regions 118 and 119 contain silicon (Si) and also contain magnesium (Mg).

The p-type semiconductor layer 114 of the semiconductor device 100 is a semiconductor layer that is located on a +Z-axis direction side of the n-type semiconductor layer 112 and is extended along the X axis and the Y axis. The p-type semiconductor layer 114 is mainly made of a nitride semiconductor and is mainly made of gallium nitride (GaN) according to this embodiment. According to this embodiment, the p-type semiconductor layer 114 is a layer of p-type semiconductor containing magnesium (Mg) as an acceptor element. According to this embodiment, the average concentration of magnesium (Mg) contained in the p-type semiconductor layer 114 may be, for example, $4 \times 10^{18}$ cm$^{-3}$. The thickness (length in the Z-axis direction) of the p-type semiconductor layer 114 is preferably not less than 0.5 μm in terms of operating the semiconductor device 100 more appropriately as a transistor and is also preferably not greater than 2.0 μm in terms of reducing the on resistance of the semiconductor device 100 and may be, for example, 1 μm according to this embodiment.

The n-type semiconductor regions 116 and 117 of the semiconductor device 100 are semiconductor areas that are on a +Z-axis direction side of the p-type semiconductor layer 114 and are extended along the X axis and the Y axis. According to this embodiment, the n-type semiconductor regions 116 and 117 are mainly made of gallium nitride (GaN). According to this embodiment, the n-type semiconductor regions 116 and 117 are n-type semiconductors containing silicon (Si) as a donor element. According to this embodiment, the n-type semiconductor regions 116 and 117 are areas formed by ion implantation of silicon (Si) into part on the +Z-axis direction side of the p-type semiconductor layer 114.

The trench 122 of the semiconductor device 100 is a groove that is formed in the n-type semiconductor layer 112 and the p-type semiconductor layer 114 and that is recessed in the thickness direction (−Z-axis direction) of the n-type semiconductor layer 112. The trench 122 is formed from the +Z-axis direction side of the p-type semiconductor layer 114 to pass through the p-type semiconductor layer 114 and reach the n-type semiconductor layer 112. According to this embodiment, the trench 122 is formed by dry etching of the n-type semiconductor layer 112 and the p-type semiconductor layer 114.

The concave portion 128 of the semiconductor device 100 is a groove that is formed in the p-type semiconductor layer 114, the n-type semiconductor layer 112 and the n-type semiconductor layer 110 and that is recessed in the thickness direction (−Z-axis direction) of the p-type semiconductor layer 114. The concave portion 128 is formed from the +Z-axis direction side of the p-type semiconductor layer 114 to pass through the p-type semiconductor layer 114 and the n-type semiconductor layer 112 and reach the n-type semiconductor layer 110. The concave portion 128 is used for formation of the drain electrode 143. According to this embodiment, the concave portion 128 is located on a +X-axis direction side of the trench 122. According to this embodiment, the concave portion 128 is formed by dry etching of the p-type semiconductor layer 114 and the n-type semiconductor layer 112.

The insulation film 130 of the semiconductor device 100 is a film having electrical insulation property. The insulation film 130 is formed from inside over to outside of the trench 122. According to this embodiment, the insulation film 130 is formed from inside of the trench 122 over to +Z-axis direction side faces of the p-type semiconductor layer 114 and the n-type semiconductor regions 116 and 117 and to inside of the concave portion 128. Accordingly the insulation film 130 also serves as a film of protecting the surface of the concave portion 128. According to this embodiment, the insulation film 130 is mainly made of silicon dioxide ($SiO_2$). According to this embodiment, the insulation film 130 is a film formed by atomic layer deposition (ALD).

The insulation film 130 has contact holes 121 and 124. The contact holes 121 and 124 are through holes that are formed to pass through the insulation film 130 and reach the semiconductor layers. According to this embodiment, the contact holes 121 and 124 are formed by wet etching of the insulation film 130.

The body electrodes 144 of the semiconductor device 100 are electrodes that are formed in the contact holes 121. According to this embodiment, the body electrodes 144 are arranged to be adjacent to and in contact with the p-type semiconductor layer 114 and the n-type semiconductor regions 117. The body electrodes 144 are arranged to be in ohmic contact with the p-type semiconductor layer 114. The ohmic contact herein denotes a contact that is different from Schottky contact and has a relatively low contact resistance. According to this embodiment, the body electrodes 144 are electrodes that are mainly made of palladium (Pd) and are subjected to annealing treatment (heat treatment) after formation on the semiconductor layer.

The source electrodes 141 of the semiconductor device 100 are electrodes that are formed in the contact holes 121. According to this embodiment, the source electrodes 141 are formed on the p-type semiconductor layer 114 and the body electrodes 144 and are arranged to be in ohmic contact with the n-type semiconductor regions 116. According to this embodiment, the source electrodes 141 are electrodes formed by stacking a layer made of aluminum (Al) on a layer made of titanium (Ti) and performing annealing treatment (heat treatment) of the stacked layers. According to this embodiment, the source electrode 141 and the body electrode 144 are electrically in contact with each other, so that a voltage of an identical potential may be applied to the source electrode 141 and the body electrode 144.

The drain electrode 143 of the semiconductor device 100 is an electrode that is formed in the contact hole 124 and is formed on (i.e., on the +Z-axis direction side of) the n-type semiconductor layer 110. The drain electrode 143 is arranged to be in ohmic contact with the n-type semiconductor layer 110. According to this embodiment, the drain electrode 143 is an electrode formed by stacking a layer made of aluminum (Al) on a layer made of titanium (Ti) and performing annealing treatment (heat treatment) of the stacked layers.

The gate electrode 142 of the semiconductor device 100 is an electrode that is formed in the trench 122 via the insulation film 130. According to this embodiment, the gate electrode 142 is mainly made of aluminum (Al). When a voltage is applied to the gate electrode 142, an inversion layer is formed in the p-type semiconductor layer 114. This inversion layer serves as a channel, so that a conductive path is formed between the source electrode 141 and the drain electrode 143. Accordingly electric current flowing between the source electrodes 141 with the body electrodes 144 and the drain electrode 143 across the n-type semiconductor layers 110 and 112 and the p-type semiconductor layer 114 by applying a voltage to the gate electrode 142.

A-2. Method of Manufacturing Semiconductor Device

Figure 2:
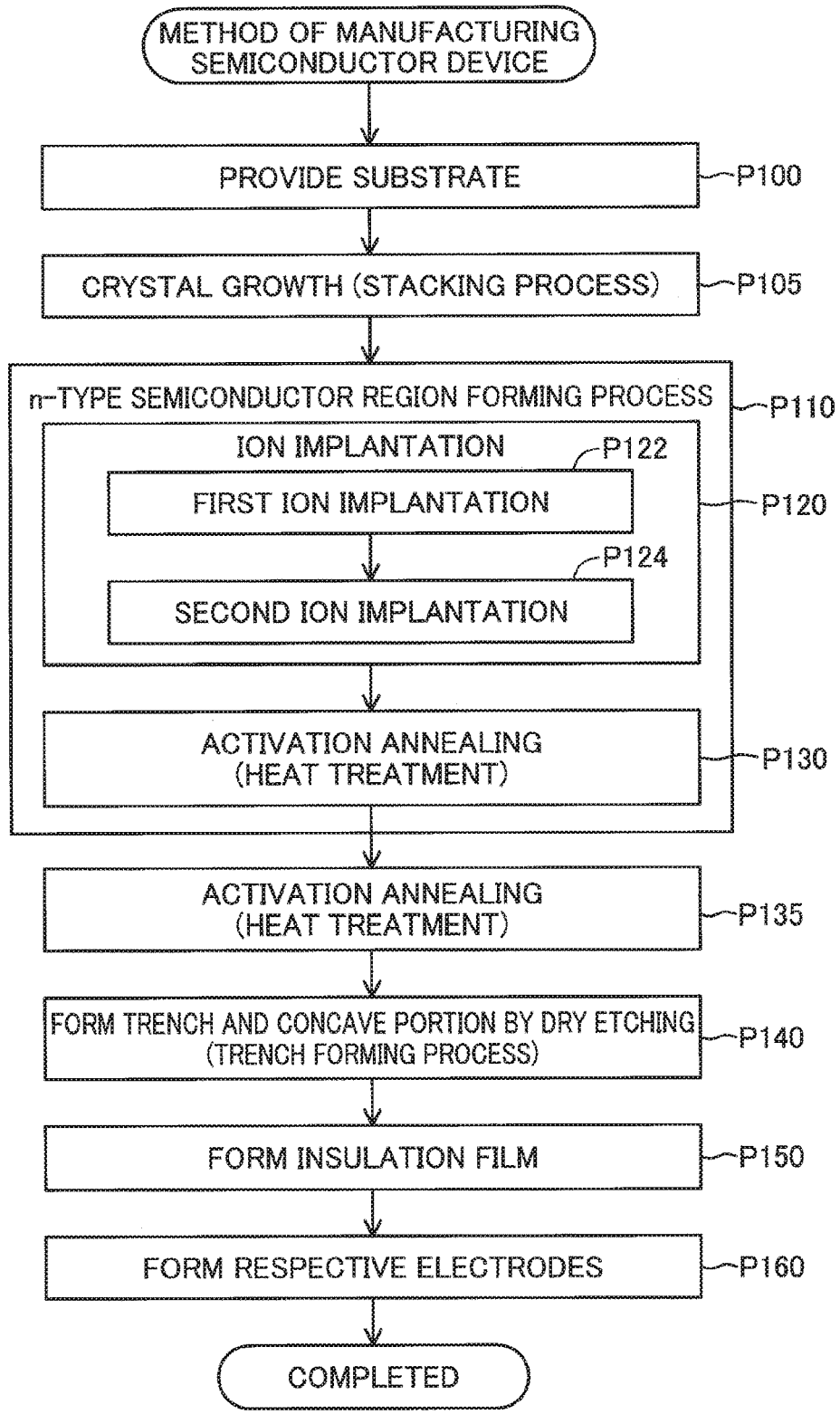
FIG. 2 is a process chart showing a method of manufacturing the semiconductor device according to the first embodiment.

FIG. 2 is a process chart showing a method of manufacturing the semiconductor device 100 according to the first embodiment. The manufacturer first provides the substrate 105 (process P100). According to this embodiment, the substrate 105 is mainly made of sapphire ($Al_2O_3$).

The manufacturer subsequently performs crystal growth (process P105). The process P105 is also called stacking process. More specifically, the manufacturer (i) stacks the buffer layer 107 on the substrate 105, (ii) stacks the n-type semiconductor layer 110 on the buffer layer 107, (iii) stacks the n-type semiconductor layer 112 on the n-type semiconductor layer 110 and (iv) stacks the p-type semiconductor layer 114 on the n-type semiconductor layer 112. According to this embodiment, the manufacturer employs metal organic chemical vapor deposition (MOCVD) as the technique of crystal growth.

Figure 3:
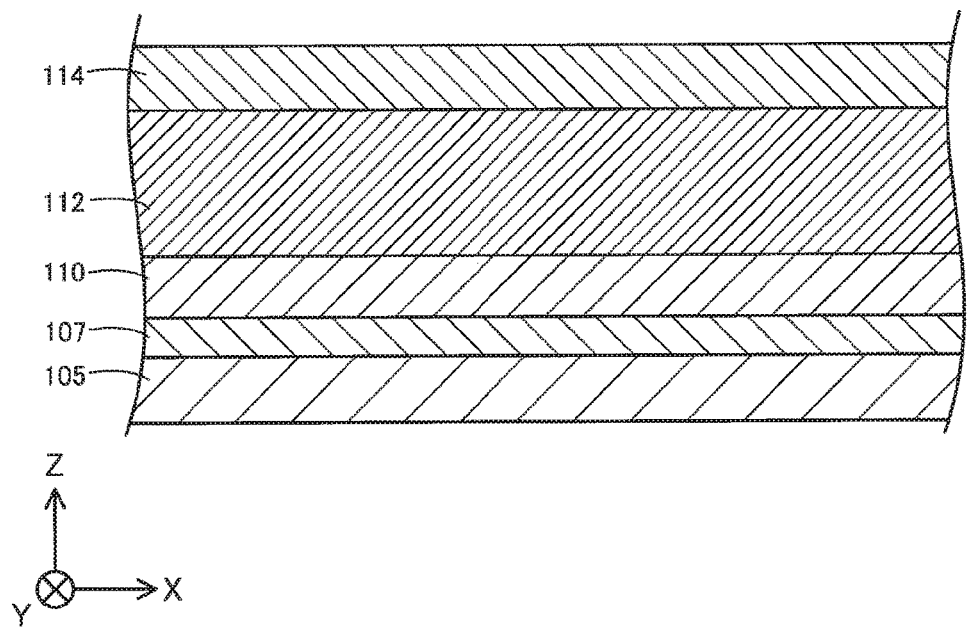
FIG. 3 is a sectional view schematically illustrating the state after a stacking process.

FIG. 3 is a sectional view schematically illustrating the state after the stacking process (process P105). According to this embodiment, the buffer layer 107 is mainly made of aluminum nitride (AlN), and the n-type semiconductor layers 110 and 112 and the p-type semiconductor layer 114 are mainly made of gallium nitride (GaN). The n-type semiconductor layers 110 and 112 are n-type semiconductors containing silicon (Si) as the donor element. The p-type semiconductor layer 114 is a p-type semiconductor containing magnesium (Mg) as the acceptor element. As shown in FIG. 3, (i) the buffer layer 107 is formed on the substrate 105; (ii) the n-type semiconductor layer 110 is formed on the buffer layer 107; (iii) the n-type semiconductor layer 112 is formed on the n-type semiconductor layer 110; and (iv) the p-type semiconductor layer 114 is formed on the n-type semiconductor layer 112.

After the stacking process (process P105 (shown in FIG. 2)), the manufacturer forms the n-type semiconductor regions 116 and 117 in part of the p-type semiconductor layer 114 (process P110). The process P110 is also called n-type semiconductor region forming process. The n-type semiconductor region forming process (process P110) includes a process of ion implantation (process P120) and a process of heat treatment (process P130).

The manufacturer implants an n-type impurity from the upper side of the p-type semiconductor layer 114 by ion implantation (process P120). According to this embodiment, the manufacture implants silicon (Si) as the n-type impurity into the p-type semiconductor layer 114 by ion implantation. More specifically, the manufacturer first forms a film 210 on the p-type semiconductor layer 114.

Figure 4:
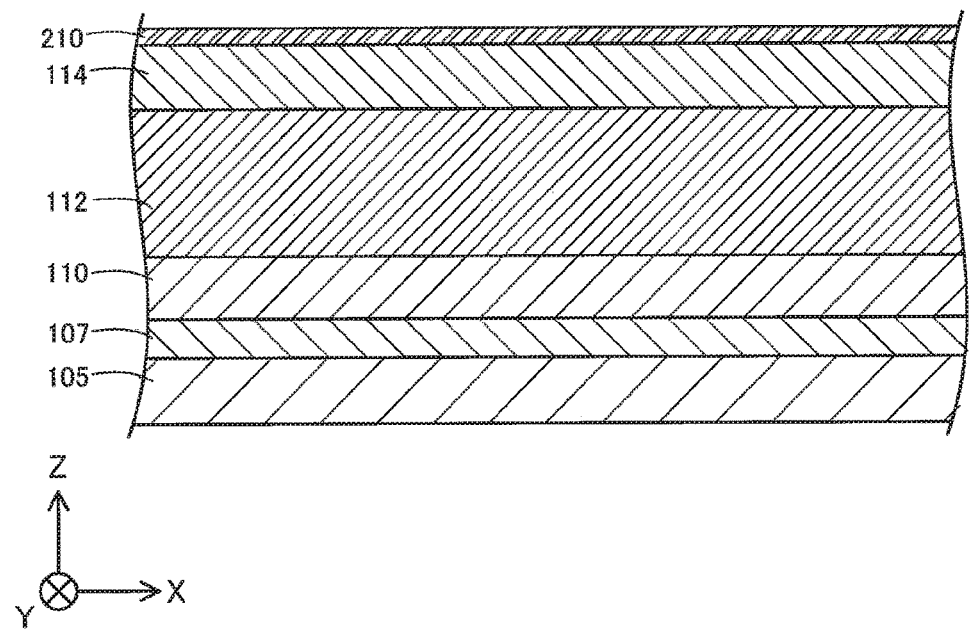
FIG. 4 is a sectional view schematically illustrating the state that a film is formed.

FIG. 4 is a sectional view schematically illustrating the state that the film 210 is formed. The film 210 is used to adjust a distribution of the impurity implanted by ion implantation in the depth direction of the p-type semiconductor layer 114. Accordingly the film 210 is used to gather the donor element implanted into the p-type semiconductor layer 114 to the vicinity of the surface of the p-type semiconductor layer 114. The film 210 also serves to protect the surface of the p-type semiconductor layer 114 from being damaged by ion implantation. According to this embodiment, a silicon dioxide ($SiO_2$) film of 30 nm in film thickness is used as the film 210. According to this embodiment, the manufacturer forms the film 210 by plasma CVD (chemical vapor deposition). The manufacturer subsequently forms a mask 220 on part of the film 210.

Figure 5:
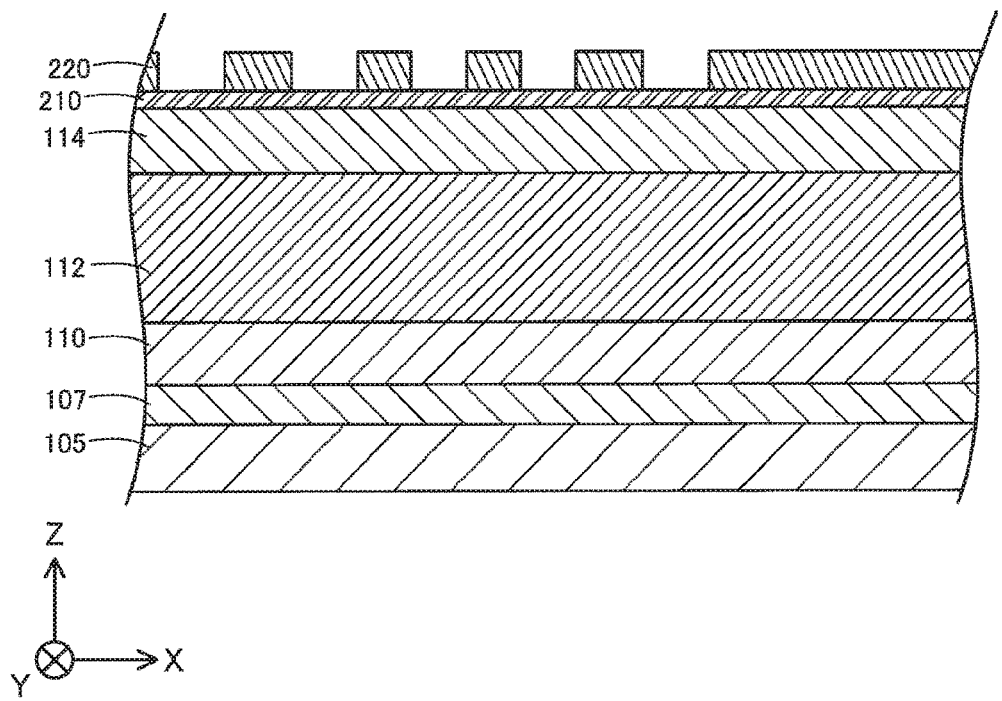
FIG. 5 is a sectional view schematically illustrating the state that a mask is formed.

FIG. 5 is a sectional view schematically illustrating the state that the mask 220 is formed. The mask 220 is formed on non-implanted areas of the p-type semiconductor layer 114 in which the donor element is not to be implanted. According to this embodiment, the shape of the mask 220 is determined by taking into account the positions in which the source electrode 141 is arranged to be in ohmic contact with the n-type semiconductor regions 116 and the positions in which the p-type impurity diffusion regions 119 are to be formed. According to this embodiment, a photoresist is used to form the mask 220. According to this embodiment, the mask 220 has a film thickness of about 2 µm.

The manufacturer subsequently performs first ion implantation from the upper side of the p-type semiconductor layer 114. According to this embodiment, first ion implantation (process P122) and second ion implantation (process P124) are performed as the process of ion implantation (process P120). The first ion implantation (process P122) is ion implantation performed to form the n-type semiconductor regions 117, and the second ion implantation (process P124) is ion implantation performed to form the n-type semiconductor regions 116.

According to this embodiment, in the first ion implantation (process P122), the manufacturer ion-implants silicon (Si) into the p-type semiconductor layer 114. According to this embodiment, the total dose amount in the first ion implantation is $2.25 \times 10^{15}$ $cm^{-2}$. According to this embodiment, the manufacturer regulates the accelerating voltage in each operation of ion implantation and performs multiple operations of ion implantation, such as to provide the silicon concentration of about $4 \times 10^{19}$ $cm^{-3}$ in an area to the depth of 0.5 µm from a +Z-axis direction-side surface of the p-type semiconductor layer 114. More specifically, the first ion implantation (process P122) is performed under the following conditions:

<Conditions of First Ion Implantation>
  First operation
  Accelerating voltage: 30 keV
  Dose amount: $0.5 \times 10^{14}$ $cm^{-2}$
  Second operation
  Accelerating voltage: 50 keV
  Dose amount: $1 \times 10^{14}$ $cm^{-2}$ Third operation
Accelerating voltage: 100 keV
Dose amount: $1\times10^{14}$ cm$^{-2}$
Fourth operation
Accelerating voltage: 150 keV
Dose amount: $2\times10^{14}$ cm$^{-2}$
Fifth operation
Accelerating voltage: 200 keV
Dose amount: $2\times10^{14}$ cm$^{-2}$
Sixth operation
Accelerating voltage: 250 keV
Dose amount: $2\times10^{14}$ cm$^{-2}$
Seventh operation
Accelerating voltage: 350 keV
Dose amount: $4\times10^{14}$ cm$^{-2}$
Eighth operation
Accelerating voltage: 500 keV
Dose amount: $1\times10^{15}$ cm$^{-2}$ The first ion implantation (process P122) forms ion implanted regions 117N (shown in FIG. 6) as areas in which the donor element is implanted in the p-type semiconductor layer 114, below non-covered portions of the film 210 that are not covered by the mask 220. The concentration of the n-type impurity in the ion implanted regions 117N may be adjusted to a desired concentration by regulating the material and the film thickness of the film 210 and regulating the accelerating voltage and the dose amount of ion implantation. The ion implanted region 117N does not have n-type electrical conductivity since the implanted n-type impurity is not activated to serve as the donor element. Accordingly the ion implanted region 117N is an area of high resistance.

The manufacturer subsequently removes the mask 220 from on the film 210. According to this embodiment, the manufacturer removes the mask 220 by wet etching. The manufacturer then forms a mask 230 on part of the film 210.

Figure 6:
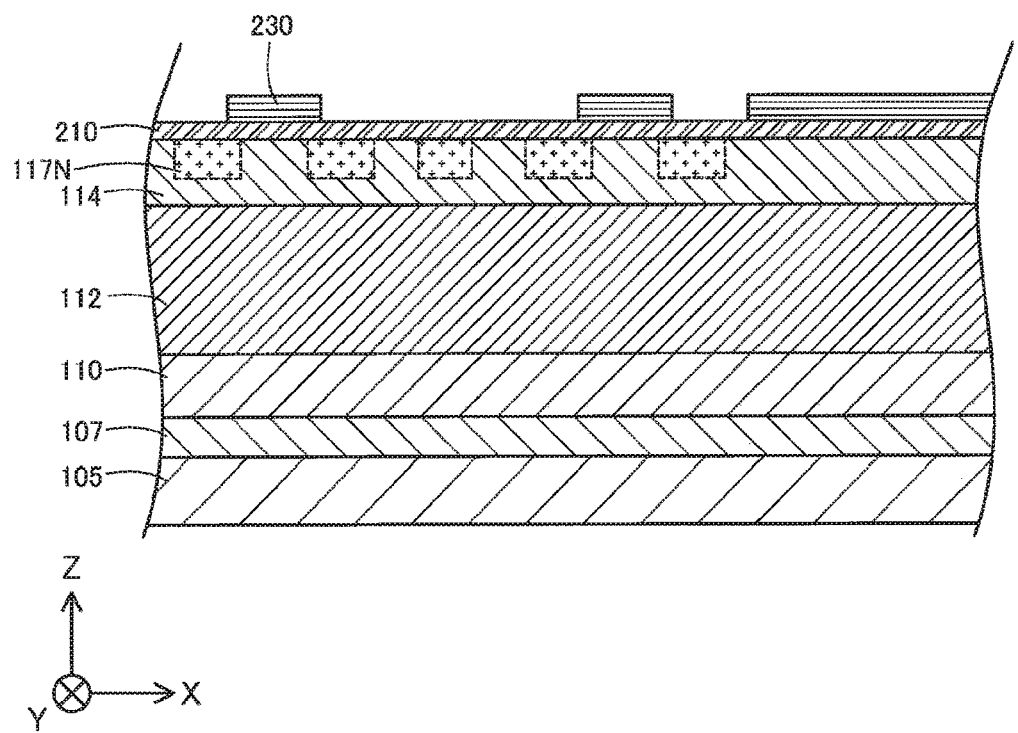
FIG. 6 is a sectional view schematically illustrating the state that a mask is formed.

FIG. 6 is a sectional view schematically illustrating the state that the mask 230 is formed. The mask 230 is formed on non-implanted areas of the p-type semiconductor layer 114 in which the donor element is not to be implanted in the second ion implantation (process P124). According to this embodiment, the shape of the mask 230 is determined by taking into account reducing the resistance between the source electrode 141 and a channel by an inversion layer formed in the p-type semiconductor layer 114 out of the resistance in the flow of electric current between the source electrode 141 and the drain electrode 143. More specifically, the mask 230 is formed to make the n-type semiconductor regions 116 at least partly overlapped with the gate electrode 142 in the view from the stacking direction of the semiconductor layers (Z-axis direction). According to this embodiment, a photoresist is used to form the mask 230. According to this embodiment, the mask 230 has a film thickness of about 2 μm.

Figure 7:
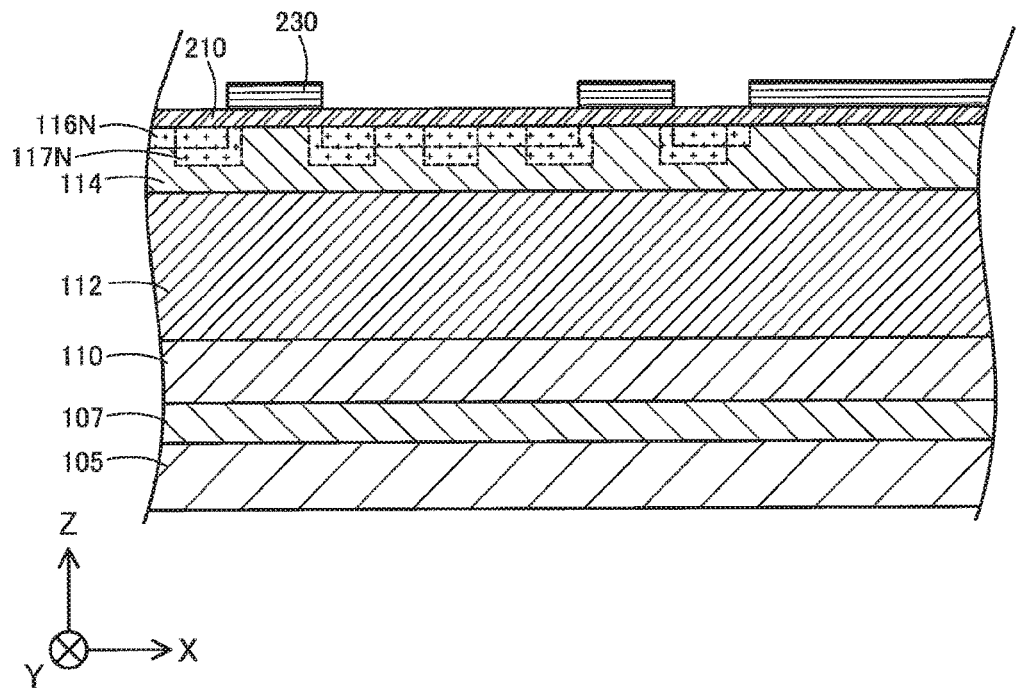
FIG. 7 is a sectional view schematically illustrating the state after second ion implantation into a p-type semiconductor layer.

The manufacturer subsequently performs the second ion implantation (process P124) from the upper side of the p-type semiconductor layer 114. According to this embodiment, the manufacturer ion-implants silicon (Si) into the p-type semiconductor layer 114. According to this embodiment, the total dose amount in this ion implantation is $1.3\times10^{15}$ cm$^{-2}$. According to this embodiment, the manufacturer regulates the accelerating voltage in each operation of ion implantation and performs multiple operations of ion implantation, such as to provide the silicon concentration of about $1\times10^{20}$ cm$^{-3}$ in an area to the depth of 0.1 μm from the +Z-axis direction-side surface of the p-type semiconductor layer 114. More specifically, this ion implantation is performed under the following conditions:

<Conditions of Second Ion Implantation>
First operation
Accelerating voltage: 50 keV
Dose amount: $6.5\times10^{14}$ cm$^{-2}$
Second operation
Accelerating voltage: 100 keV
Dose amount: $6.5\times10^{14}$ cm$^{-2}$ FIG. 7 is a sectional view schematically illustrating the state after the second ion implantation into the p-type semiconductor layer 114. The second ion implantation forms ion implanted regions 116N as areas in which the donor element is implanted in the p-type semiconductor layer 114, below non-covered portions of the film 210 that are not covered by the mask 230.

Like the ion implanted regions 117N, the concentration of the n-type impurity in the ion implanted regions 116N may be adjusted to a desired concentration by regulating the material and the film thickness of the film 210 and regulating the accelerating voltage and the dose amount of ion implantation. The ion implanted region 116N also does not have n-type electrical conductivity since the implanted n-type impurity is not activated to serve as the donor element. Accordingly the ion implanted region 116N is also an area of high resistance.

The concentration of silicon in the ion implanted regions 116N and 117N is preferably higher than the concentration of magnesium in the p-type semiconductor layer 114, is more preferably twice or higher than the concentration of magnesium in the p-type semiconductor layer 114, is furthermore preferably four times or higher than the concentration of magnesium in the p-type semiconductor layer 114 and is especially preferably five times or higher than the concentration of magnesium in the p-type semiconductor layer 114. The concentration of silicon in the ion implanted regions 116N and 117N is also preferably not higher than $1\times10^{22}$ cm$^{-3}$, in terms of not reducing the crystallinity in the p-type semiconductor layer 114.

The manufacturer subsequently removes the film 210 and the mask 230 from on the p-type semiconductor layer 114. According to this embodiment, the manufacturer removes the film 210 and the mask 230 by wet etching. This completes the ion implantation (process P120 (shown in FIG. 2)).

After the ion implantation (process P120), the manufacturer performs activation annealing (heat treatment) to activate the n-type impurity in the ion implanted regions 116N and 117N (process P130). In the process P130, the manufacturer heats the p-type semiconductor layer 114 and the ion implanted regions 116N and 117N, so as to form the n-type semiconductor regions 116 and 117 having the n-type electrical conductivity in the p-type semiconductor layer 114. The manufacturer first forms a cap film 240 on the p-type semiconductor layer 114 and the ion implanted regions 116N and 117N.

Figure 8:
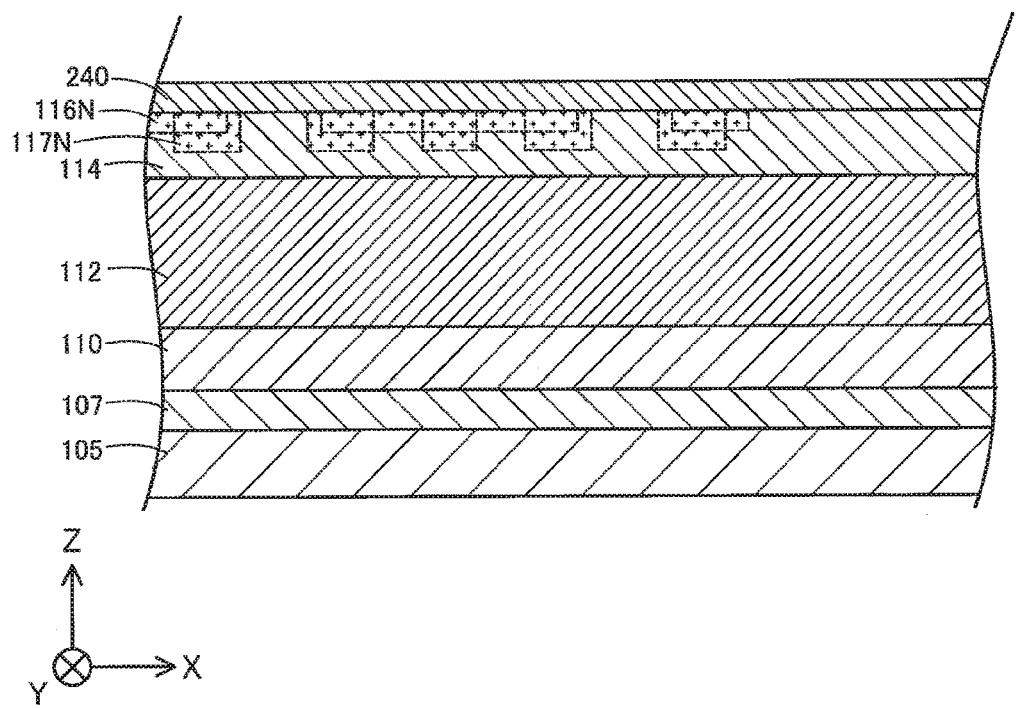
FIG. 8 is a sectional view schematically illustrating the state that a cap film is formed.

FIG. 8 is a sectional view schematically illustrating the state that the cap film 240 is formed. The cap film 240 serves to protect the surfaces of the p-type semiconductor layer 114 and the ion implanted regions 116N and 117N from being damaged by heating. According to this embodiment, the manufacturer forms the cap film 240 by sputtering. According to this embodiment, the cap film 240 is mainly made of silicon nitrides (SiNx).

The manufacturer subsequently heats the p-type semiconductor layer 114 and the ion implanted regions 116N and 117N. In terms of further improving the breakdown voltage of the semiconductor device 100, the heating temperature of the p-type semiconductor layer 114 and the ion implanted regions 116N and 117N is preferably not lower than 1000° C. and not higher than 1400° C. and is more preferably not lower than 1050° C. and not higher than 1250° C. In terms of further improving the breakdown voltage of the semiconductor device 100, the heating time is preferably not shorter than 1 minute and not longer than 10 minutes and is more preferably not shorter than 1 minute and not longer than 5 minutes. According to this embodiment, the manufacturer performs heat treatment under the following conditions:

<Conditions of Heat Treatment>

Atmosphere gas: nitrogen

Heating temperature: 1150° C.

Heating time: 4 minutes

After the heat treatment, the manufacturer removes the cap film 240 from on the p-type semiconductor layer 114 and the ion implanted regions 116N and 117N (i.e., the n-type semiconductor regions 116 and 117). According to this embodiment, the manufacturer removes the cap film 240 by wet etching. This terminates the activation annealing (process P130 (shown in FIG. 2)) and at the same time completes the n-type semiconductor region forming process (process P110).

Figure 9:
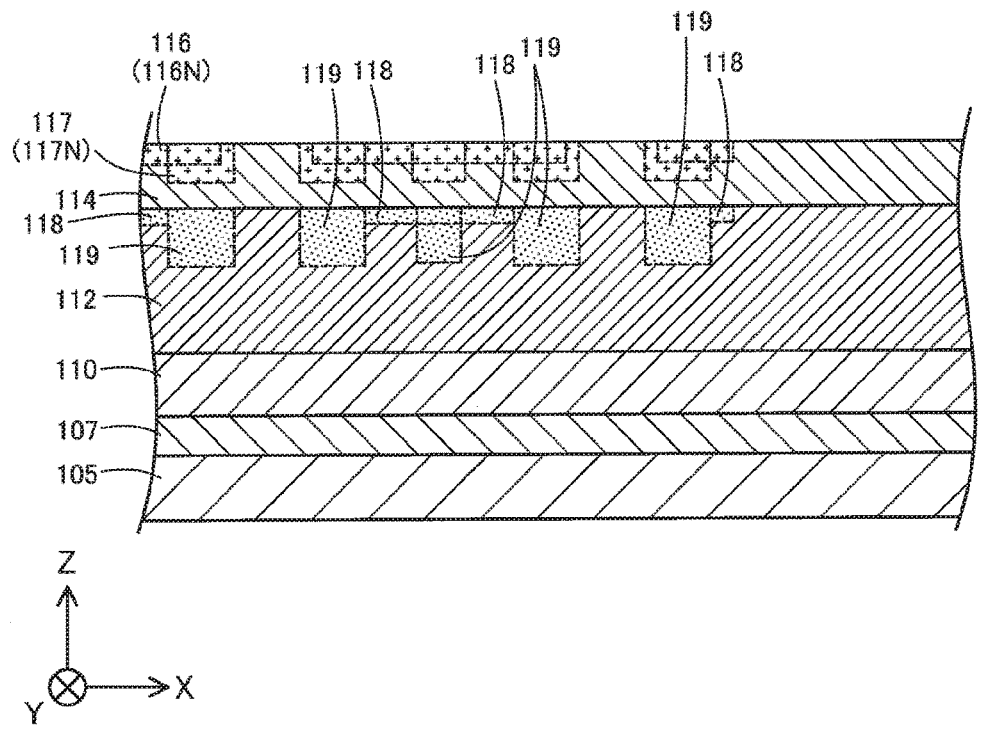
FIG. 9 is a sectional view schematically illustrating the state after completion of activation annealing.

FIG. 9 is a sectional view schematically illustrating the state after completion of the activation annealing (process P130). The activation annealing (process P130 (shown in FIG. 2)) changes the ion implanted regions 116N to the n-type semiconductor regions 116, while changing the ion implanted regions 117N to the n-type semiconductor regions 117.

The p-type impurity diffusion regions 118 and 119 are formed in the areas that are located below the n-type semiconductor regions 116 and 117 and are on the +Z-axis direction side of the n-type semiconductor layer 112 by the ion implantation (process P120) and the heat treatment (process P130), i.e., by the n-type semiconductor region forming process (process P110). More specifically, the p-type impurity diffusion regions 118 are located below the n-type semiconductor regions 116, and the p-type impurity diffusion regions 119 are located below the n-type semiconductor regions 117. The p-type impurity diffusion regions 118 and 119 are areas formed by diffusing the p-type impurity included in the p-type semiconductor layer 114 into the n-type semiconductor layer 112. The concentration of the p-type impurity included in the p-type impurity diffusion regions 118 and 119 may be adjusted by regulating the accelerating voltage and the dose amount in the ion implantation (process P120) and regulating the heating temperature and the heating time of the heat treatment (process P130). For example, the concentration of the p-type impurity diffused in the p-type impurity diffusion regions 118 and 119 may be increased by increasing the accelerating voltage or increasing the dose amount in the ion implantation (process P120).

After the n-type semiconductor region forming process (process P110 (shown in FIG. 2)), the manufacturer performs activation annealing (heat treatment) to activate magnesium (Mg) in the p-type semiconductor layer 114 (process P135). According to this embodiment, the heat treatment is performed at 700° C. for 5 minutes in a nitrogen atmosphere having the ratio of oxygen ($O_2$) flow rate to nitrogen ($N_2$) flow rate of 5%. The conditions of heat treatment are, however, not specifically limited to these conditions. In another example, the heat treatment may be performed at 900° C. for 10 minutes in a nitrogen atmosphere that does not contain oxygen ($O_2$). The activation annealing (heat treatment) for activating magnesium (Mg) in the p-type semiconductor layer 114 may be performed after formation of the p-type semiconductor layer 114 (process P105) and before the n-type semiconductor region forming process (process P110).

After the activation annealing (process P135), the manufacturer forms the trench 122 and the concave portion 128 by dry etching (process P140). The process P140 is also called trench forming process.

Figure 10:
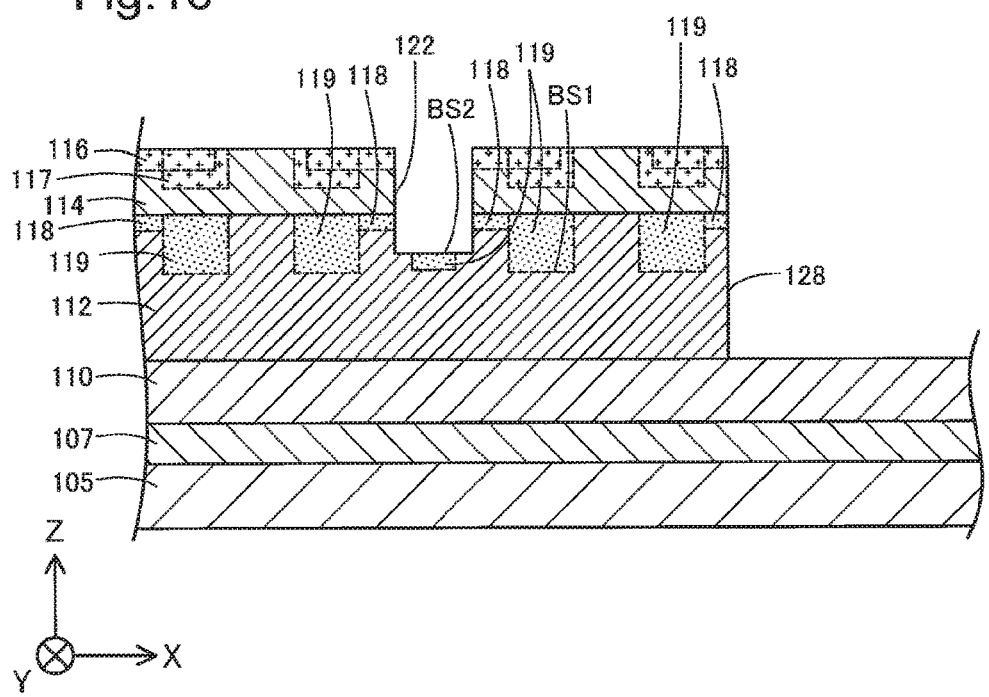
FIG. 10 is a sectional view schematically illustrating the state that a trench and a concave portion are formed.

FIG. 10 is a sectional view schematically illustrating the state that the trench 122 and the concave portion 128 are formed. The manufacturer forms the trench 122 that is recessed to pass through the p-type semiconductor layer 114 and reach the n-type semiconductor layer 112 and the concave portion 128 that is recessed to pass through the p-type semiconductor layer 114 and the n-type semiconductor layer 112 and reach the n-type semiconductor layer 110. According to this embodiment, the manufacturer forms the trench 122 and the concave portion 128 by dry etching using a chlorine-based gas.

A bottom face BS1 of the p-type impurity diffusion regions 118 and 119 is located to be flush with a bottom face BS2 of the trench 122 or is located below (on the −Z-axis direction side of) the bottom face BS2 of the trench 122, with respect to the stacking direction of the n-type semiconductor layer 112 and the p-type semiconductor layer 114 (Z-axis direction). According to this embodiment, the bottom face BS1 of the p-type impurity diffusion regions 118 and 119 is located below (on the −Z-axis direction side of) the bottom face BS2 of the trench 122. The "bottom face BS1 of the p-type impurity diffusion regions 118 and 119" herein denotes a most −Z-axis direction side interface of the p-type impurity diffusion regions 118 and 119. The "bottom face BS2 of the trench 122" herein denotes a most −Z-axis direction side face of the trench 122.

According to this embodiment, the trench forming process (process P140) is performed after the n-type semiconductor region forming process (process P110). In the trench forming process (process P140), the trench 122 is formed at a location that is overlapped with part of the p-type impurity diffusion region 119. Accordingly part of the bottom face BS2 of the trench 122 is formed by the p-type impurity diffusion region 119.

After forming the trench 122 and the concave portion 128 (process P140), the manufacturer forms the insulation film 130 inside of the trench 122 (process P150). According to this embodiment, the manufacturer forms the insulation film 130 on exposed surfaces of the n-type semiconductor layers 110 and 112 and the p-type semiconductor layer 114 by ALD.

The manufacturer subsequently forms the source electrodes 141, the body electrodes 144, the gate electrode 142 and the drain electrode 143 (process P160). More specifically, the manufacturer forms the contact holes 121 and 124 (shown in FIG. 1) in the insulation film 130 by wet etching. The manufacturer subsequently forms the body electrodes 144 in the contact holes 121 to be adjacent to and in contact with the p-type semiconductor layer 114 and the n-type semiconductor regions 117, and forms the source electrodes 141 on the n-type semiconductor regions 116 and the body electrodes 144. The manufacturer also forms the drain electrode 143 in the contact hole 124 to be adjacent to and in contact with the n-type semiconductor layer 110. Accordingly the manufacturer forms the drain electrode 143 on (i.e., on the +Z-axis direction side of) the n-type semiconductor layer 110. Annealing treatment (heat treatment) is performed to provide the ohmic contact in the process of forming the body electrodes 144, the source electrodes 144 and the drain electrode 143. The annealing treatment (heat treatment) may be performed after formation of each of the electrodes or may be performed collectively after formation of the body electrodes 141 and the source electrodes 141. The annealing treatment (heat treatment) may be performed collectively after formation of the body electrodes 144, the source electrodes 141 and the drain electrode 143. The manufacturer then forms the gate electrode 142 on the insulation film 130 in the trench 122. The semiconductor device 100 is completed by the series of processes described above.

A-3. Advantageous Effects

The method of manufacturing the semiconductor device 100 according to the first embodiment forms the p-type impurity diffusion regions 118 and 119 in the n-type semiconductor region forming process (process P110) without ion implantation of a p-type impurity. Accordingly the method of manufacturing the semiconductor device 100 according to the first embodiment suppresses the potential crowding in the vicinity of the outer periphery of the bottom face BS2 of the trench 122. As a result, the method of manufacturing the semiconductor device 100 according to the first embodiment improves the breakdown voltage of the semiconductor device.

In the method of manufacturing the semiconductor device 100 according to the first embodiment, the bottom face BS1 of the p-type impurity diffusion regions 118 and 119 is located to be flush with the bottom face BS2 of the trench 122 or is located below (on the −Z-axis direction side of) the bottom face BS2 of the trench 122, with respect to the stacking direction of the n-type semiconductor layer 112 and the p-type semiconductor layer 114 (Z-axis direction). The method of manufacturing the semiconductor device 100 according to the first embodiment thus more effectively suppresses the potential crowding in the vicinity of the outer periphery of the bottom face BS2 of the trench 122.

In the method of manufacturing the semiconductor device 100 according to the first embodiment, part of the bottom face BS2 of the trench 122 is formed by the p-type impurity diffusion region 119. The method of manufacturing the semiconductor device 100 according to the first embodiment thus further effectively suppresses the potential crowding in the vicinity of the outer periphery of the bottom face BS2 of the trench 122.

The following describes the results of an evaluation test supporting that the p-type impurity diffusion regions 118 and 119 are formed in the n-type semiconductor layer 112 by the n-type semiconductor region forming process (process P110) described above.

A-4. Evaluation Test

Samples described below were used in the evaluation test. The examiner provided samples 1 to 3. More specifically, the examiner provided the substrate 105 (process P100) and performed crystal growth (process P105) by the same method as that of the first embodiment. The examiner subsequently provided (i) sample 1 with the heat treatment (process P130) but without the ion implantation (process P120), (ii) sample 2 with the ion implantation (process P120) but without the heat treatment (process P130) and (iii) sample 3 with the heat treatment (process P130) after the ion implantation (process P120). Accordingly the samples 1 to 3 have the following relations. The examiner performed both the first ion implantation to form the n-type semiconductor regions 117 (process P122) and the second ion implantation to form the n-type semiconductor regions 116 (process P124) as the ion implantation.

Figure 11:
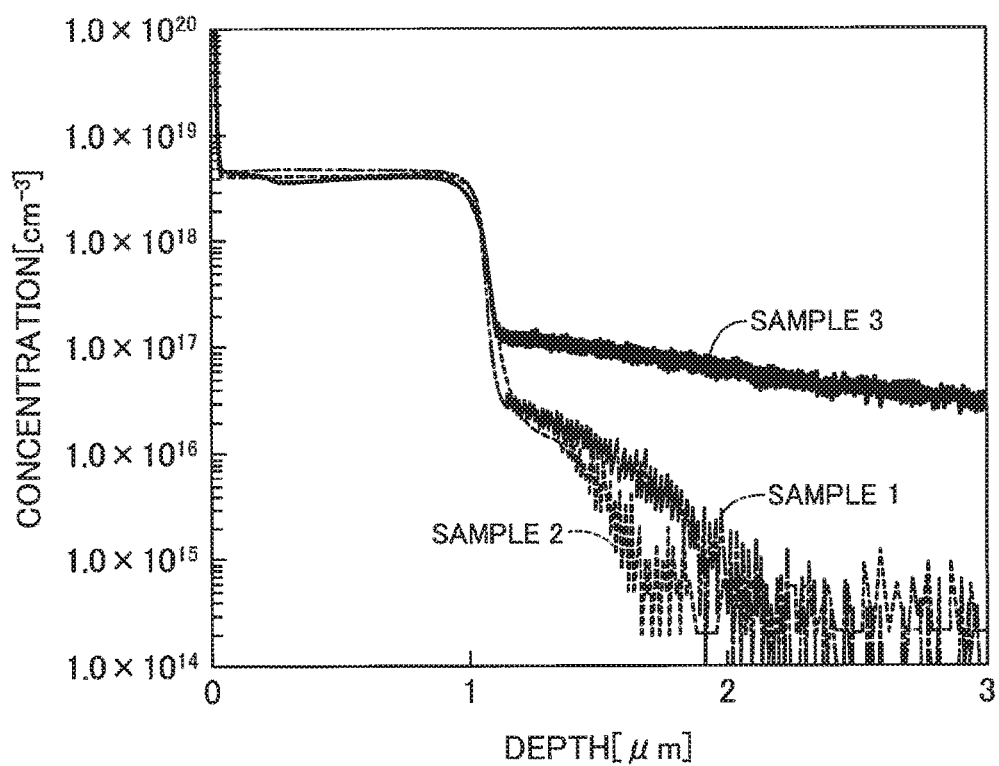
FIG. 11 is a diagram showing the results of an evaluation test.

Sample 1: without ion implantation, with heat treatment
Sample 2: with ion implantation, without heat treatment
Sample 3: with ion implantation, with heat treatment FIG. 11 is a diagram showing the results of the evaluation test. FIG. 11 shows the measurement results of the concentration of magnesium (Mg) as the impurity in the p-type semiconductor layer 114 and the n-type semiconductor layer 112 of the respective samples by secondary ion mass spectrometry (SIMS). The abscissa axis of FIG. 11 shows the depth (μm) in the −Z-axis direction of the p-type semiconductor layer 114 and the n-type semiconductor layer 112, and the ordinate axis shows the concentration ($cm^{-3}$) of magnesium (Mg). The depth of 0 μm indicates the +Z-axis direction-side surface of the p-type semiconductor layer 114 (shown in FIG. 1).

FIG. 11 shows the following. An area at the depth of 0 μm to about 1 μm is an area having a substantially constant magnesium concentration of about $4 \times 10^{18}$ $cm^{-3}$ and is an area corresponding to the p-type semiconductor layer 114. An area at the depth of not less than about 1.0 μm is an area corresponding to the n-type semiconductor layer 112.

The results of FIG. 11 show diffusion of magnesium (Mg) into the n-type semiconductor layer 112 in the sample with the heat treatment after the ion implantation (sample 3). The results of FIG. 11 also show that the concentration of magnesium in the n-type semiconductor layer 112 is higher than $5 \times 10^{16}$ $cm^{-3}$ in an area to at least the depth of 2 μm, while the average concentration of silicon in the n-type semiconductor layer 112 is $5 \times 10^{16}$ $cm^{-3}$ according to the embodiment. This accordingly shows that the concentration of magnesium is higher than the concentration of silicon in an area to the depth of 1 μm from a +Z-axis direction-side interface of the n-type semiconductor layer 112.

The results of FIG. 11 show slight diffusions of magnesium (Mg) into the n-type semiconductor layer 112 in the sample without the ion implantation (sample 1) and in the sample without the heat treatment (sample 2). According to the results of FIG. 11, however, the diffusions of the samples 1 and 2 do not reach such a level that affects the electrical properties of the n-type semiconductor layer 112 and are sufficiently smaller than the diffusion in the sample with the heat treatment after the ion implantation (sample 3).

As described above, the results of the evaluation test show that the p-type impurity diffusion regions 118 and 119 are formed in the n-type semiconductor layer 112 by the above n-type semiconductor region forming process (process P110) of the n-type semiconductor layer 112 and the p-type semiconductor layer 114.

B. Second Embodiment

Figure 12:
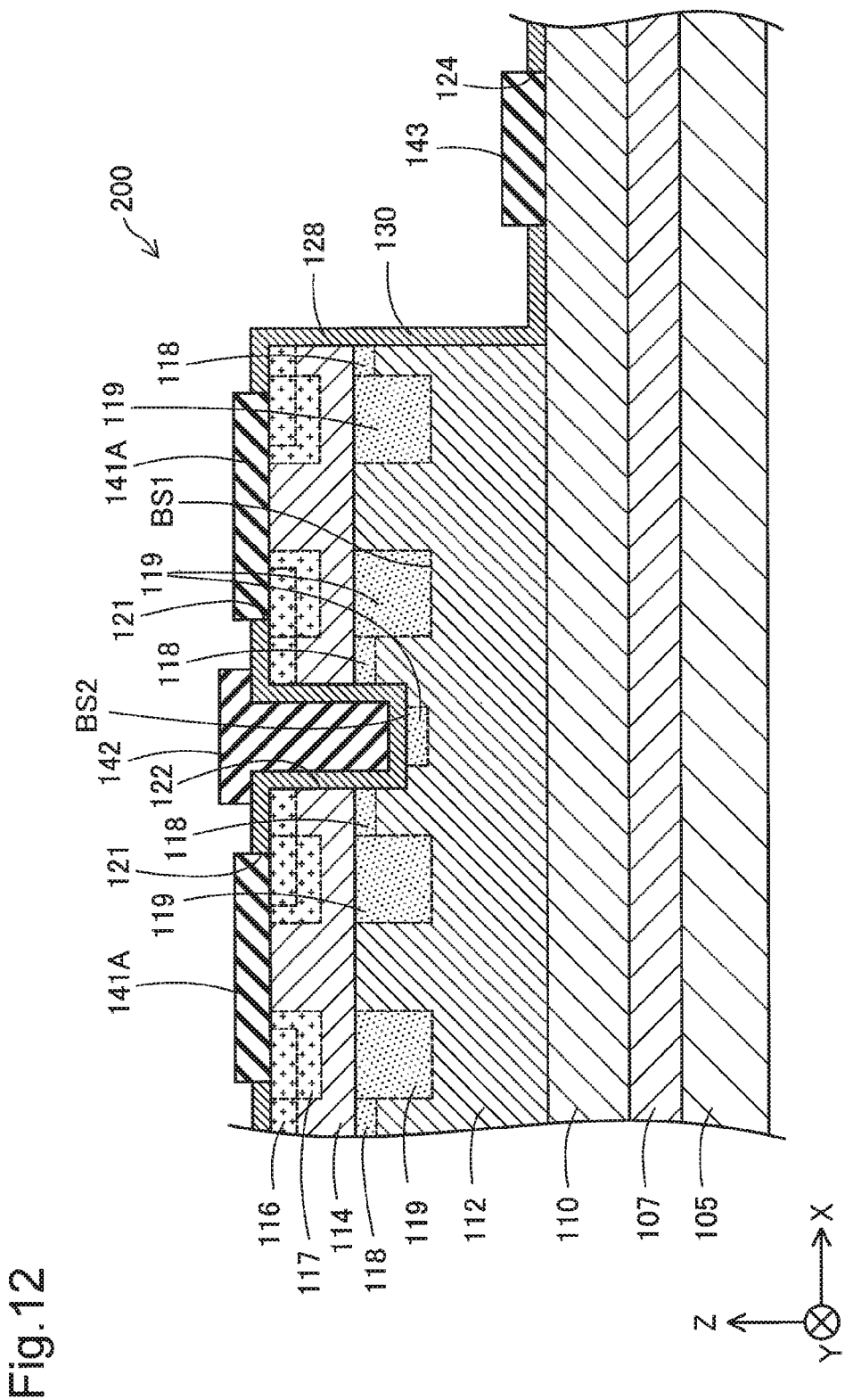
FIG. 12 is a sectional view schematically illustrating the structure of a semiconductor device according to a second embodiment.

FIG. 12 is a sectional view schematically illustrating the structure of a semiconductor device 200 according to a second embodiment. The semiconductor device 200 of the second embodiment differs from the semiconductor device 100 of the first embodiment by providing source electrodes 141A that have the functions of both the source electrode 141 and the body electrode 144 of the semiconductor device 100, but otherwise has a similar structure to that of the semiconductor device 100 of the first embodiment. The source electrode 141A of the second embodiment is an electrode formed by stacking a layer made of palladium (Pd), a layer made of titanium (Ti) and a layer made of aluminum (Al) and performing annealing treatment (heat treatment) of the stacked layers. According to another embodiment, the source electrode 141A may have a single layer structure of only a layer made of palladium (Pd) without stacking a layer made of titanium (Ti) and a layer made of aluminum (Al).

Like the first embodiment, the manufacturing method of the second embodiment also suppresses the potential crowding in the vicinity of the outer periphery of the bottom face BS2 of the trench 122 without ion implantation of a p-type impurity. The manufacturing method of the second embodiment does not need to separately form the source electrodes 141 and the body electrodes 144 but forms the source electrodes 141A in one step, unlike the manufacturing method of the first embodiment. This reduces the production time.

C. Third Embodiment

Figure 13:
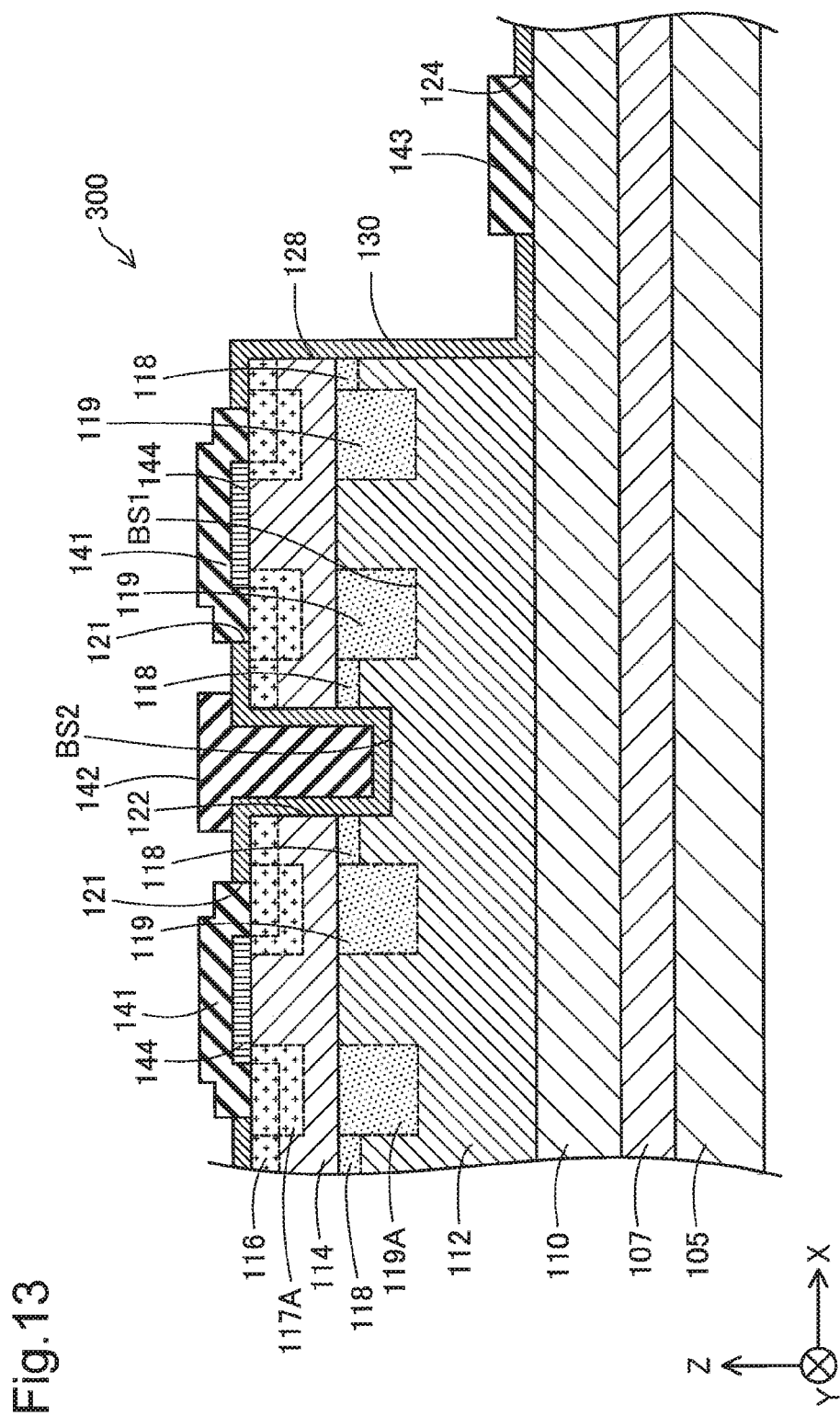
FIG. 13 is a sectional view schematically illustrating the structure of a semiconductor device according to a third embodiment.

FIG. 13 is a sectional view schematically illustrating the structure of a semiconductor device 300 according to a third embodiment. The semiconductor device 300 of the third embodiment differs from the semiconductor device 100 of the first embodiment by the configuration that part of the bottom face BS2 of the trench 122 is not formed by the p-type impurity diffusion region 119, but otherwise has a similar structure to that of the semiconductor device 100 of the first embodiment. In other words, the locations where n-type semiconductor regions 117A are formed in the semiconductor device 300 are different from the locations where the n-type semiconductor regions 117 are formed in the semiconductor device 100. Accordingly the locations where p-type impurity diffusion regions 119A are formed in the semiconductor device 300 are different from the locations where the p-type impurity diffusion regions 119 are formed in the semiconductor device 100. Otherwise the structure of the semiconductor device 300 is similar to the structure of the semiconductor device 100.

Like the first embodiment, the manufacturing method of the third embodiment also suppresses the potential crowding in the vicinity of the outer periphery of the bottom face BS2 of the trench 122 without ion implantation of a p-type impurity. In the semiconductor device 100 of the first embodiment, part of the bottom face BS2 of the trench 122 is formed by the p-type impurity diffusion region 119. This configuration more effectively suppresses the potential crowding in the vicinity of the outer periphery of the bottom face BS2 of the trench 122. In the manufacturing method of the third embodiment, on the other hand, part of the bottom face BS2 of the trench 122 is not formed by the p-type impurity diffusion layer 119. This configuration enables the n-type semiconductor region forming process to be performed after the trench forming process and accordingly allows for a flexible change of the manufacturing process.

D. Fourth Embodiment

Figure 14:
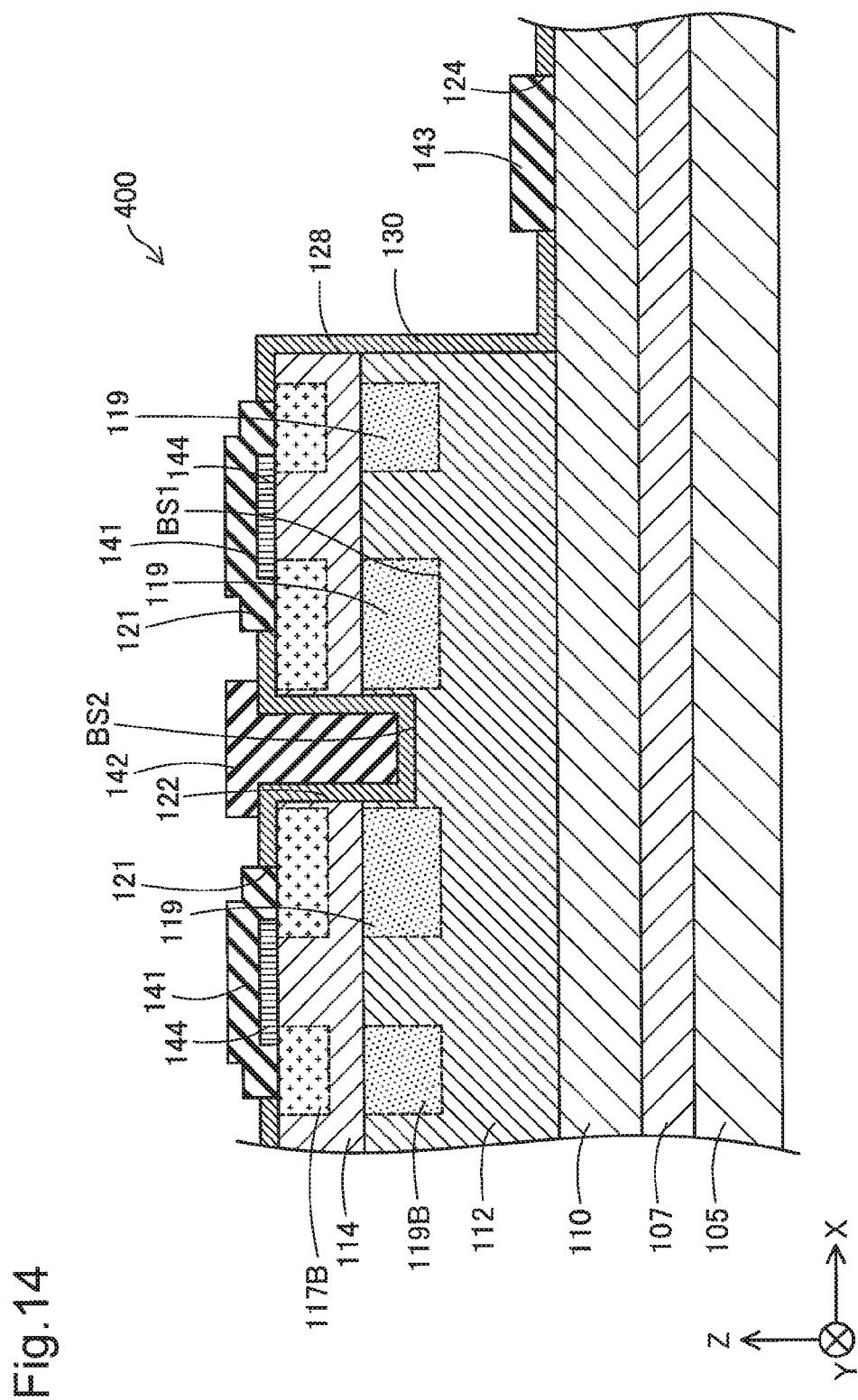
FIG. 14 is a sectional view schematically illustrating the structure of a semiconductor device according to a fourth embodiment.

FIG. 14 is a sectional view schematically illustrating the structure of a semiconductor device 400 according to a fourth embodiment. The semiconductor device 400 of the fourth embodiment differs from the semiconductor device 300 of the third embodiment by that (i) the n-type semiconductor regions 116 are not formed, so that the p-type impurity diffusion regions 118 are not formed; and (ii) the locations where n-type semiconductor regions 117B are formed in the semiconductor device 400 are different from the locations where the n-type semiconductor regions 117A are formed in the semiconductor device 300. Otherwise the structure of the semiconductor device 400 is similar to the structure of the semiconductor device 300. According to the fourth embodiment, the locations where the n-type semiconductor regions 117B are formed are determined such that the gate electrode 142 is at least partly overlapped with the n-type semiconductor region 117B in the view from the Z-axis direction, in order to turn on the transistor.

Like the first embodiment, the manufacturing method of the fourth embodiment also suppresses the potential crowding in the vicinity of the outer periphery of the bottom face BS2 of the trench 122 without ion implantation of a p-type impurity. The manufacturing method of the fourth embodiment does not perform both the first ion implantation and the second ion implantation but needs to perform only the first ion implantation to form the n-type semiconductor regions 117B, unlike the manufacturing method of the first embodiment. This reduces the production time.

E. Fifth Embodiment

Figure 15:
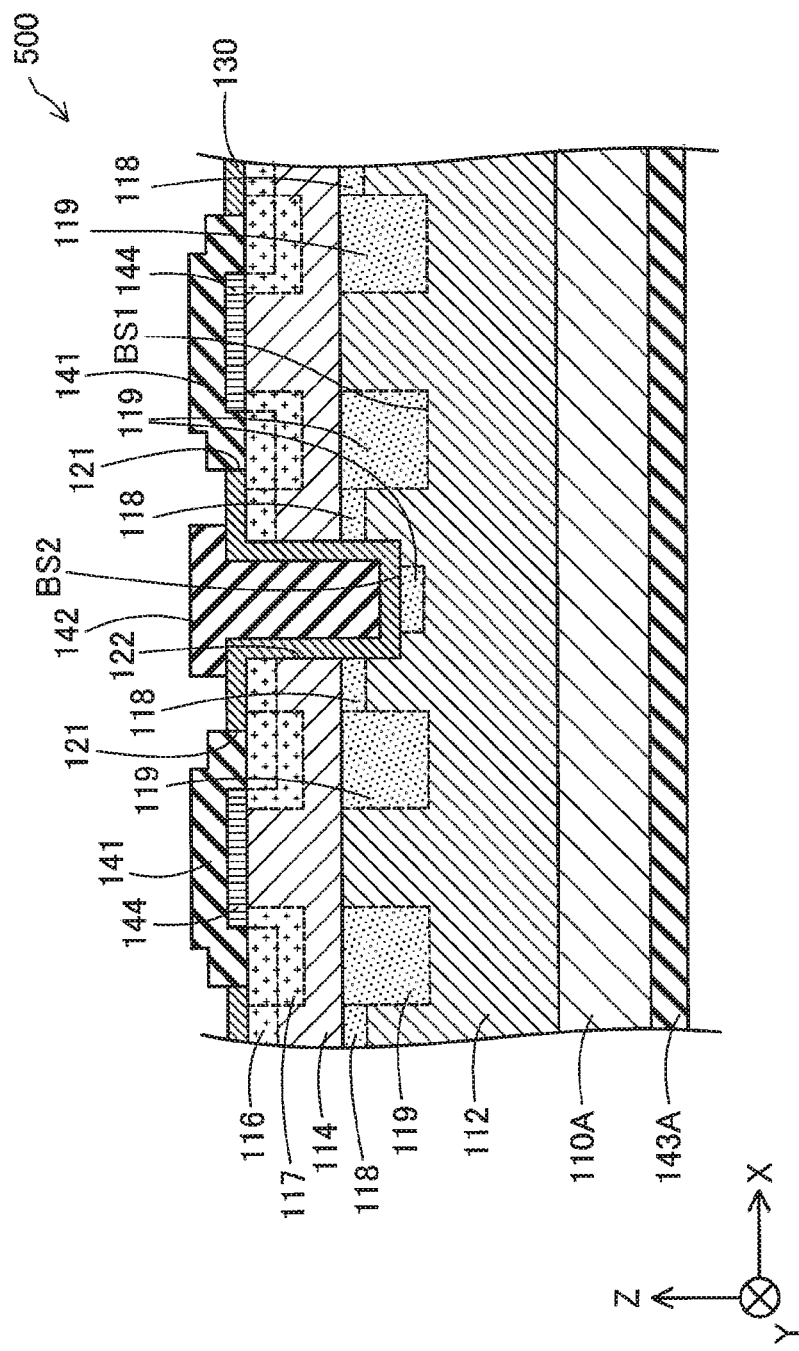
FIG. 15 is a sectional view schematically illustrating the structure of a semiconductor device according to a fifth embodiment.

FIG. 15 is a sectional view schematically illustrating the structure of a semiconductor device 500 according to a fifth embodiment. The semiconductor device 500 of the fifth embodiment differs from the semiconductor device 100 of the first embodiment by that (i) the substrate 105 and the buffer layer 107 are omitted; (ii) a gallium nitride substrate 110A is used in place of the n-type semiconductor layer 110; and (iii) a drain electrode 143A is provided on a −Z-axis direction side face of the gallium nitride substrate 110A. Otherwise the structure of the semiconductor device 500 is similar to the structure of the semiconductor device 100. According to this embodiment, the concentration of silicon in the gallium nitride substrate 110A is $1.0 \times 10^{18}$ cm$^{-3}$. According to this embodiment, the concentration of silicon in the n-type semiconductor layer 112 is $1.0 \times 10^{16}$ cm$^{-3}$, and the film thickness of the n-type semiconductor layer 112 is 10 μm.

According to the fifth embodiment, the gallium nitride substrate 110A and the semiconductor layer formed thereon are formed from the semiconductor made of the same material, unlike the first to the fourth embodiments. Using the different substrate from those of the first to the fourth embodiments provides a different degree of diffusion of the p-type impurity included in the p-type semiconductor layer 114 into the n-type semiconductor layer 112. This results in providing a different concentration of the p-type impurity in the p-type impurity diffusion regions 118 and 119. The fifth embodiment increases the dose amount in the ion implantation (process P120), such that the concentration of the p-type impurity diffused in the p-type impurity diffusion regions 118 and 119 is a value corresponding to the concentration in the n-type semiconductor layer 112. More specifically, both the first ion implantation (process P122) and the second ion implantation (process P124) are performed with doubling the respective dose amounts but with keeping the accelerating voltages unchanged.

Like the first embodiment, the manufacturing method of the fifth embodiment also suppresses the potential crowding in the vicinity of the outer periphery of the bottom face BS2 of the trench 122 without ion implantation of a p-type impurity.

F. Other Embodiments

The disclosure is not limited to any of the embodiments, the examples and the modifications described above but may be implemented by a diversity of other configurations without departing from the scope of the disclosure. For example, the technical features of any of the embodiments, the examples and the modifications corresponding to the technical features of each of the aspects described in SUMMARY may be replaced or combined appropriately, in order to solve part or all of the problems described above or in order to achieve part or all of the advantageous effects described above. Any of the technical features may be omitted appropriately unless the technical feature is described as essential herein.

The semiconductor device to which the present disclosure is applied is not limited to the vertical trench MISFET described in the above embodiments. The semiconductor device to which the present disclosure is applied may be, for example, a semiconductor device that has a trench gate structure and controls the electric current based on the principle of forming an inversion layer by a control electrode, such as an insulated gate bipolar transistor (IGBT).

In the above embodiments, magnesium (Mg) is used as the p-type impurity. In the present disclosure, however, this is not essential. The p-type impurity used may be, for example, beryllium (Be), carbon (C) or zinc (Zn).

In the above embodiments, silicon (Si) is used as the n-type impurity. In the present disclosure, however, this is not essential. The n-type impurity used may be, for example, oxygen (O) or germanium (Ge).

In the above embodiments, the material of the substrate is not limited to sapphire ($Al_2O_3$) or gallium nitride (GaN) but may be another semiconductor such as silicon (Si), gallium oxide ($Ga_2O_3$), aluminum nitride (AlN) or silicon carbide (SiC). Similarly the material of the semiconductor layer is not limited to gallium nitride (GaN) but may be another semiconductor such as silicon (Si) or silicon carbide (SiC).

The first embodiment performs ion implantation twice, i.e., the first ion implantation (process P122) and the second ion implantation (process P124), in the ion implantation (process P120). The number of times of ion implantation may, however, be once or may be three times or more. The conditions of ion implantation (for example, the accelerating voltage and the dose amount) may be adequately regulated according to the degree of implantation of the donor element.

In the above embodiments, the material of the insulation film may be any material having electrical insulation properties. The material of the insulation film other than silicon dioxide ($SiO_2$) may be, for example, at least one of silicon nitrides (SiNx), aluminum oxide ($Al_2O_3$), aluminum nitride (AlN), zirconium oxide ($ZrO_2$), hafnium oxide ($HfO_2$), silicon oxynitride (SiON), aluminum oxynitride (AlON), zirconium oxynitride (ZrON) and hafnium oxynitride (HfON). The insulation film may be a single layer structure or may be a two layer or more layer structure. The technique employed to form the insulation film is not limited to ALD but may be, for example, ECR sputtering or ECR-CVD.

In the above embodiments, the materials of the respective electrodes are not limited to the materials described above but may be other materials. For example, nickel (Ni) or platinum (Pt) may be used, instead of palladium (Pd), for the body electrodes 144 and the source electrodes 141A.

In the above embodiments, the semiconductor device 100 includes two n-type-semiconductor layers, i.e., the n-type semiconductor layer 110 and the n-type semiconductor layer 112. The present disclosure is, however, not limited to this configuration. The semiconductor device may include only one n-type semiconductor layer or may include three or more n-type semiconductor layers.

In the above embodiments, the bottom face BS1 of the p-type impurity diffusion regions 118 and 119 is located to be flush with the bottom face BS2 of the trench 122 or is located below (on the −Z-axis direction side of) the bottom face BS2 of the trench 122, with respect to the stacking direction of the n-type semiconductor layer 112 and the p-type semiconductor layer 114 (Z-axis direction). The present disclosure is, however, not limited to this configuration. The bottom face BS1 of the p-type impurity diffusion regions 118 and 119 may be located above (on the +Z-axis direction side of) the bottom face BS2 of the trench 122, with respect to the stacking direction of the n-type semiconductor layer 112 and the p-type semiconductor layer 114 (Z-axis direction).

The invention claimed is:

1. A method of manufacturing a semiconductor device having a trench gate structure, comprising:
    a stacking process of stacking a p-type semiconductor layer containing a p-type impurity on an n-type semiconductor layer containing an n-type impurity;
    an n-type semiconductor region forming process of forming an n-type semiconductor region in at least part of the p-type semiconductor layer by ion-implanting an n-type impurity into the p-type semiconductor layer and performing heat treatment to activate the ion-implanted n-type impurity; and
    a trench forming process of forming a trench that is recessed to pass through the p-type semiconductor layer and reach the n-type semiconductor layer, wherein
    in the n-type semiconductor region forming process, a p-type impurity diffusion region in which the p-type impurity contained in the p-type semiconductor layer is diffused is formed in at least part of the n-type semiconductor layer that is located below the n-type semiconductor region.

2. The method of manufacturing the semiconductor device according to claim 1,
    wherein a bottom face of the p-type impurity diffusion region is located to be flush with a bottom face of the trench or is located below the bottom face of the trench with respect to a direction of the stacking.

3. The method of manufacturing the semiconductor device according to claim 2,
    wherein the trench forming process is performed after the n-type semiconductor region forming process, and
    in the trench forming process, the trench is formed at a location that is overlapped with at least part of the p-type impurity diffusion region, and at least part of the bottom face of the trench is formed by the p-type impurity diffusion region.

4. The method of manufacturing the semiconductor device according to claim 1,
    wherein the stacking process comprises a process of stacking a buffer layer on a substrate and a process of stacking the n-type semiconductor layer on the buffer layer, wherein
    the substrate is formed from a semiconductor different from semiconductors of the n-type semiconductor layer and the p-type semiconductor layer.

5. The method of manufacturing the semiconductor device according to claim 4, further comprising:
    a process of forming an insulation film inside of the trench;
    a process of forming a first electrode that is adjacent to and in contact with the n-type semiconductor region;
    a process of forming a second electrode on the n-type semiconductor layer; and
    a process of forming a control electrode configured to control a flow of electric current between the first electrode and the second electrode, on the insulation film.

6. The method of manufacturing the semiconductor device according to claim 1,
    wherein each of the n-type semiconductor layer and the p-type semiconductor layer is mainly made of a nitride semiconductor.

7. A semiconductor device manufactured by the method of manufacturing the semiconductor device according to claim 1.

8. The method of manufacturing the semiconductor device according to claim 1, wherein the forming of the n-type semiconductor region comprises:
- a first ion-implanting of an n-type impurity to form a first ion-implanted region in the p-type semiconductor layer; and
- a second ion-implanting of an n-type impurity to form a second ion-implanted region in the p-type semiconductor layer.

9. The method of manufacturing the semiconductor device according to claim 8, wherein the forming of the n-type semiconductor region further comprises:
- forming a protective film on the p-type semiconductor layer;
- forming a first mask on the protective film, the first mask being used in the first ion-implanting to form the first ion-implanted region; and
- removing the first mask and forming a second mask on the protective film, the second mask being used in the second ion-implanting to form the second ion-implanted region.

10. The method of manufacturing the semiconductor device according to claim 9, wherein the forming of the n-type semiconductor region further comprises:
- after the second ion-implanting, removing the second mask and the protective film; and
- forming a cap film on the p-type semiconductor layer, the heat treatment being performed after the forming of the cap film.

11. The method of manufacturing the semiconductor device according to claim 8, wherein the performing of the heat treatment activates the n-type impurity implanted in the first ion-implanting and the n-type impurity implanted in the second ion-implanting.

12. The method of manufacturing the semiconductor device according to claim 8, wherein a depth of the first ion-implanted region in the p-type semiconductor layer is different than a depth of the second ion-implanted region in the p-type semiconductor layer.

13. The method of manufacturing the semiconductor device according to claim 8, wherein the p-type impurity diffusion region comprises a first p-type impurity diffusion region formed under the first ion-implanted region and a second p-type impurity diffusion region formed under the second ion-implanted region.

14. The method of manufacturing the semiconductor device according to claim 13, wherein a depth of the first p-type impurity diffusion region in the n-type semiconductor layer is different than a depth of the second p-type impurity diffusion region in the n-type semiconductor layer.

15. A method of manufacturing a semiconductor device comprising:
- forming a p-type semiconductor layer including a p-type impurity on an n-type semiconductor layer including an n-type impurity;
- forming an n-type semiconductor region in the p-type semiconductor layer by ion-implanting an n-type impurity into the p-type semiconductor layer; and
- performing heat treatment so as to:
  - activate the ion-implanted n-type impurity; and
  - diffuse the p-type impurity from a portion of the p-type semiconductor layer that is between the n-type semiconductor region and the n-type semiconductor layer, into the n-type semiconductor layer to form a p-type impurity diffusion region in the n-type semiconductor layer.

16. The method of manufacturing the semiconductor device according to claim 15, wherein the forming of the n-type semiconductor region comprises:
- a first ion-implanting of an n-type impurity to form a first ion-implanted region in the p-type semiconductor layer; and
- a second ion-implanting of an n-type impurity to form a second ion-implanted region in the p-type semiconductor layer.

17. The method of manufacturing the semiconductor device according to claim 16, wherein a depth of the first ion-implanted region in the p-type semiconductor layer is different than a depth of the second ion-implanted region in the p-type semiconductor layer.

18. The method of manufacturing the semiconductor device according to claim 16, wherein the p-type impurity diffusion region comprises a first p-type impurity diffusion region formed under the first ion-implanted region and a second p-type impurity diffusion region formed under the second ion-implanted region.

19. The method of manufacturing the semiconductor device according to claim 16, wherein the performing of the heat treatment activates the n-type impurity implanted in the first ion-implanting and the n-type impurity implanted in the second ion-implanting.

* * * * *